United States Patent
Lu et al.

(10) Patent No.: US 6,589,398 B1
(45) Date of Patent: Jul. 8, 2003

(54) PASTING METHOD FOR ELIMINATING FLAKING DURING NITRIDE SPUTTERING

(75) Inventors: Jean Qing Lu, Palo Alto, CA (US); Jeffrey Andrew Tobin, Mountain View, CA (US); Linda Lee Stenzel, Mount Hermon, CA (US); Lananh Pham, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/112,264

(22) Filed: Mar. 28, 2002

(51) Int. Cl.[7] .............................................. C23C 14/35
(52) U.S. Cl. ......................... 204/192.12; 204/192.15; 204/192.17; 204/192.18; 204/192.22; 204/298.12; 204/298.2
(58) Field of Search ................... 204/192.12, 192.15, 204/192.17, 192.18, 192.22, 298.12, 298.2

(56) References Cited

U.S. PATENT DOCUMENTS

| | | | | |
|---|---|---|---|---|
| 4,622,121 A | * | 11/1986 | Wegmann et al. | 204/298.12 |
| 4,957,605 A | * | 9/1990 | Hurwitt et al. | 204/192.12 |
| 5,232,571 A | * | 8/1993 | Braymen | 204/192.22 |
| 6,471,831 B2 | * | 10/2002 | Lu et al. | 204/192.12 |
| 6,500,321 B1 | * | 12/2002 | Ashtiani et al. | 204/298.12 |

* cited by examiner

Primary Examiner—Rodney G. McDonald
(74) Attorney, Agent, or Firm—Beyer Weaver & Thomas, LLP

(57) ABSTRACT

The present invention pertains to methods for preventing metal or metal-derived material from flaking during sputter processing of substrates. Methods of the invention are particularly useful for non-planar sputter targets. The magnetic field configuration in a sputter apparatus is modulated during a pasting process. Flaking from regions of the target, shield, or other internal components of the sputter apparatus is inhibited by pasting methods which include encapsulation and optionally removal of material, for example by erosion via high density plasma.

16 Claims, 6 Drawing Sheets

PASTING METHOD FOR ELIMINATING FLAKING DURING NITRIDE SPUTTERING

FIELD OF THE INVENTION

The present invention pertains to methods for preventing flaking of metals or metal-derived materials from interior surfaces of a sputter apparatus during a sputter process. More specifically the invention pertains to pasting methods for sputter apparatus that use non-planar sputter targets.

BACKGROUND OF THE INVENTION

Magnetron sputtering is often used to coat substrates with materials. Magnetron sputtering is particularly useful because higher sputter rates can be achieved relative to sputtering methods that do not use magnetic fields. Magnetron sputtering is particularly useful for integrated circuit fabrication, more specifically depositing thin films onto semiconductor substrates.

Traditionally, a planar target made of a particular metal, alloy, or other conductive material is used as a source of material to be sputtered onto a substrate. During sputtering, the target serves as a cathode in an electrical circuit, and a magnetic field is established for confinement of electrons (from the target) near the target surface. This magnetic confinement greatly increases the possibility of ionizing collisions and thus the sputter rate. In conventional systems, a fixed magnetic field configuration is used.

A significant problem that arises in magnetron sputtering is build-up and flaking of sputtered material from interior surfaces of sputter apparatus to substrates within the sputter apparatus. This is particularly problematic in semiconductor fabrication. For example a metal target is used for sputtering a metal nitride onto a wafer. The target is sputtered in the presence of a small amount of nitrogen gas to produce the metal nitride in-situ during sputtering. Over time, metal nitride is deposited on, for example, shielding plates within the sputtering process chamber. Inherent stress in the deposited film of metal nitride causes it to flake off. When this flaking occurs during a sputter process, the substrate is contaminated with the particles of metal nitride, damaging delicate circuitry.

One method to control flaking is termed "pasting." For example, with respect to a metal nitride flaking problem as described above, periodically a layer of the target metal is sputtered over metal nitride material deposited on process chamber interior surfaces in order to encapsulate the metal nitride. When planar targets are sputtered, full-face erosion of target material from the targets' planar surface is typically achieved, that is, during sputtering target material is evenly removed from the target surface and no material is re-deposited onto the target. In such examples, only deposited material on surfaces other than the target require encapsulation.

More recently, non-planar targets have found use in magnetron sputtering. For example, in hollow cathode magnetron (HCM) sputtering, cup-shaped targets are used. With non-planar targets such as these, fixed magnetic field configurations often cause uneven erosion profiles on the target surface due to the variation in the target sputter surface. During sputtering, sputtered material is re-deposited onto some target surface areas where the magnetic field configuration does not permit erosion. Flaking of re-deposited material from such areas of non-planar targets is problematic. Traditional pasting methods do not prevent flaking from these target areas.

What is needed therefore are improved methods of preventing flaking of metals and metal-derived materials from interior surfaces of a sputter apparatus during a sputter process. More specifically, methods that prevent flaking from non-planar sputter targets as well as other interior surfaces of sputter apparatus that use such targets.

SUMMARY OF THE INVENTION

The present invention pertains to methods for preventing metal or metal-derived material from flaking during sputter processing of substrates. Methods of the invention are particularly useful for non-planar sputter targets. The magnetic field configuration in a sputter apparatus is modulated during a pasting process. Flaking from regions of the target, shield, or other internal components of the sputter apparatus is inhibited by pasting methods which include encapsulation and optionally removal of material, for example by erosion via high density plasma.

Thus one aspect of the invention is a method of preventing a metal or a metal-derived material from flaking from a surface within a sputter apparatus during a sputter process that uses a non-planar target. Such methods may be characterized by modulating the magnetic field configuration in the sputter apparatus during a pasting process. Preferably modulating the magnetic field configuration in the sputter apparatus during the pasting process includes pasting using a first magnetic field configuration; and pasting using a second magnetic field configuration. Preferably each of a plurality of electromagnetic coils used for pasting using the first magnetic field configuration have the same polarity as when used for the sputter process. In preferred embodiments, the order of pasting process elements is interchangeable. In a particularly preferred embodiment, the pasting process begins with pasting using the second magnetic field configuration, followed by pasting using the first magnetic field configuration. In this way, once the pasting process is complete, apparatus are more readily configured to continue the sputter process as before. Preferably, the second magnetic field configuration is produced by changing the polarity of at least one of the plurality of electromagnetic coils used for pasting using the first magnetic field configuration.

Preferably the second magnetic field configuration is used to create a high-density plasma at a region of the non-planar target where a deposit of a sputtered material exists, the deposit created during a previous sputter process. In some embodiments, the second magnetic field configuration is used to create a high-density plasma at a region of the non-planar target where a deposition-erosion boundary exists, the deposition-erosion boundary created during a previous sputter process.

Preferably pasting using the first magnetic field configuration takes between about 60 and 200 seconds, more preferably about 120 seconds; and pasting using the second magnetic field configuration takes between about 10 and 60 seconds, more preferably about 20 seconds.

Preferably the metal includes at least one of tantalum, titanium, tungsten, copper, cobalt, molybdenum, zirconium, chromium, and alloys thereof. Preferably the metal-derived material is a metal nitride. Metal nitrides of the invention preferably include at least one of tantalum nitride, titanium nitride, and tungsten nitride.

Preferably the sputter process is used to deposit the metal-derived material sequentially on a plurality of semiconductor wafers and the pasting process is repeated after between about 25 and 500 wafers have been exposed to the sputter process, more preferably between about 200 and 500 wafers. Put another way, preferably pasting methods of the invention are performed after the target has been used for between about 10 and 200 kWh, more preferably between about 80 and 200 kWh.

These and other features and advantages of the present invention will be described in more detail below with reference to the associated drawings.

DETAILED DESCRIPTION OF THE PREFERRED EMBODIMENTS

Figure 1:
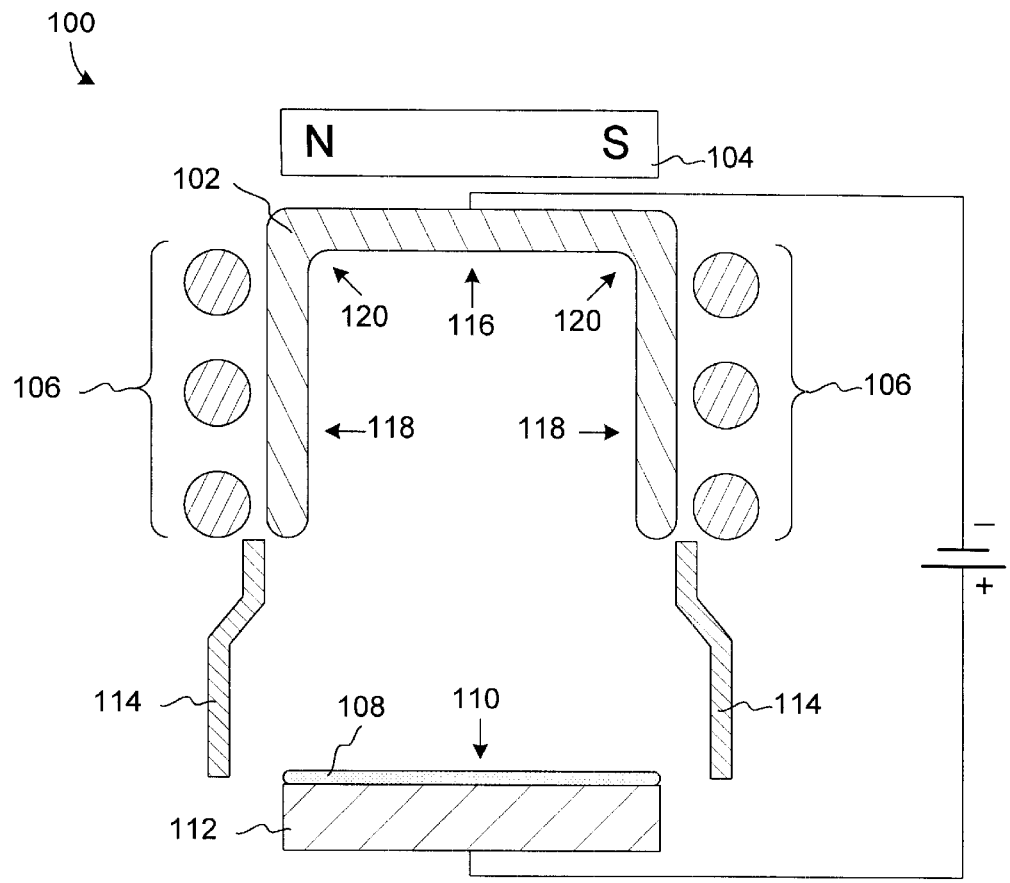
FIG. 1 is a simplified cross-sectional diagram of a sputter apparatus.

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, methods of the invention are described in relation to semiconductor wafer processing. However, the invention is not so limited. In some instances well-known processes, procedures, and components have not been described in detail so as not to unnecessarily obscure aspects of the present invention.

DEFINITIONS

In order to describe certain embodiments of the invention, some terms used herein are defined as follows. These definitions are provided to assist the reader in understanding the concepts exemplified in the specification and the definitions do not necessarily limit the scope of this invention.

Wafer—The following description identifies a semiconductor wafer as an example work piece in relation to sputtering of materials and preventing contamination thereon. The invention is not so limited. The work piece may be of various shapes, sizes, and materials. In addition to semiconductor wafers, other work pieces that may take advantage of this invention include various articles such as printed circuit boards, flat panel displays, and the like. In this application, the term "wafer" will be used interchangeably with "wafer substrate", and "substrate." One skilled in the art would understand that these terms could refer to a silicon (semiconductor) wafer during any of many stages of integrated circuit fabrication thereon.

Pasting—In more constrained terms, "pasting" refers to sputtering (or otherwise depositing) a second material over a first sputtered material in order to encapsulate the first sputtered material with the second. The invention is not so limited. "Pasting" more generally refers to a process whereby flaking (detachment of a sputtered material from an interior surface of a sputter apparatus) is prevented. This may include not only encapsulation as described above, but also removal (e.g. via erosion) of the material prior to processing a work piece. Pasting can include combinations of removal and encapsulation. For example, a portion of a sputtered material may be removed and the remaining portion encapsulated.

Planar sputter target—A planar sputter target is defined as a target that has only one surface from which material is sputtered, and that surface is substantially planar. Conventional planar targets have any number of polygon shapes, e.g. rectangular or circular, with a single planar surface that is used for erosion of target material during sputtering.

Non-planer sputter target—A non-planar sputter target refers to a target that has only one surface from which material is sputtered, and that surface is substantially non-planar, e.g. a curved target surface such as a parabolic target surface; or a target that has multiple surfaces that intersect at some angle. An example of the latter would be a cup-shaped target, such as a hollow cylinder with a closed planar end.

METHODS OF THE INVENTION

The current invention implements pasting methods that are effective for sputter apparatus that use non-planar targets. As mentioned, the invention prevents metal or metal-derived material from flaking during sputter processing of substrates. The magnetic field configuration in a sputter apparatus is modulated during a pasting process. Flaking from regions of the target, shield, or other internal components of the sputter apparatus is inhibited by pasting methods which include encapsulation and or removal of material, for example by erosion via high density plasma. One apparatus that is particularly useful in performing methods of the invention is the INOVA xT process system, available from Novellus Systems, of San Jose Calif. The INOVA xT process system includes a hollow cathode magnetron (HCM) sputtering source. A generic description of such a source is provided below in relation to FIG. 1.

Figure 2:
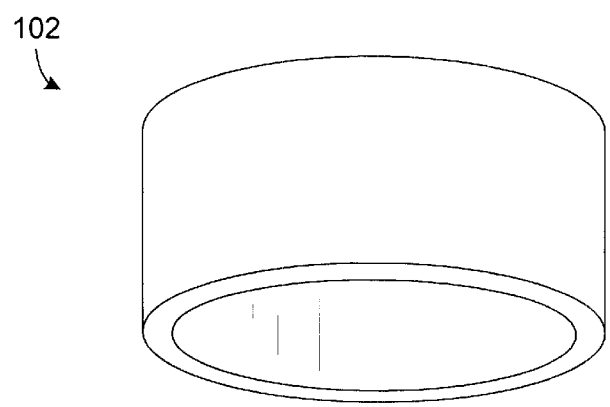
FIG. 2 is a perspective of a non-planar sputter target.

FIG. 1 shows a simplified cross-sectional diagram of a sputter apparatus, 100, for which methods of the invention are particularly useful. Apparatus 100 includes a cup-shaped sputter target 102 (see FIG. 2 for a perspective of target 102). Preferably non-planar targets of the invention are metals which include at least one of tantalum, titanium, tungsten, copper, cobalt, molybdenum, zirconium, chromium, and alloys thereof. Arranged about the exterior surfaces of target 102 are magnets, including a permanent magnet 104 and electromagnetic coils 106. Target 102 serves as a cathode in an electrical circuit (preferably a DC circuit). A wafer 108 (via wafer holder 112) serves as the anode. Shields 114 are designed to protect more sensitive parts (not shown) of the sputter apparatus from exposure to plasma.

Sputter deposition of the target material onto the wafer is carried out in a self-sustained glow discharge that is created by the breakdown of a heavy inert gas such as argon. Preferably the target metal or a metal-derived material (produced in-situ from the target metal or sputtered directly from a metal-derived target) is deposited onto wafer surface 110 in the sputter process. One particularly preferred metal-derived material of the invention is a metal-nitride. Preferably metal-nitrides of the invention include at least one of tantalum nitride, titanium nitride, and tungsten nitride.

As mentioned, metals and metal-derived materials often build up on interior surfaces of sputter apparatus as a result of the sputter process. For example, in the case of apparatus as described in relation to FIG. 1 when producing in-situ metal nitrides, build-up and subsequent flaking occur on shields 114 and in the corner areas, 120, of target 102. Planar areas 116 and 118 of the target exhibit even erosion profiles, that is, there is no net build-up of material on these surface areas. Particularly at the interface of the built up material in the corners and the planar eroded areas (i.e. deposition-erosion boundaries), flaking occurs. Methods of the invention prevent flaking from substantially all interior surfaces of sputter apparatus. In this example, flaking from shields 114 and corner areas 120 (including the deposition-erosion boundaries) of non-planar target 102 is prevented.

Figure 3:
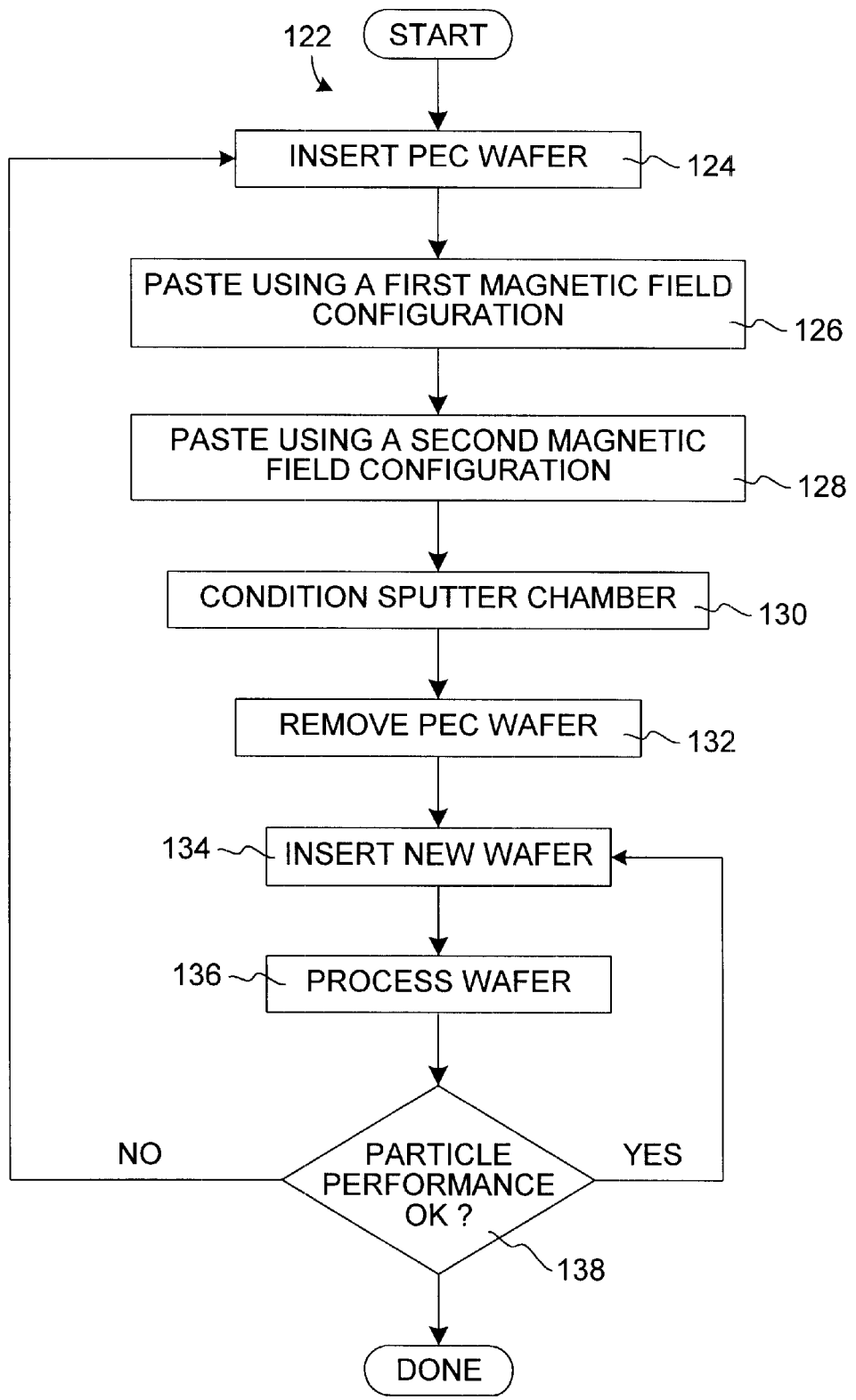
FIGS. 3–5 are flowcharts depicting aspects of process flows in accordance with the invention.

FIG. 3 is a flowchart showing aspects of a pasting method, 122, in accordance with the invention. In a preferred embodiment, nitrogen gas is added to argon in a metal sputter process to produce metal-nitrides in-situ for deposition on wafers. Preferred nitrides of the invention are described above. Method 122 is described in relation to apparatus as described above. Methods of the invention may include more or less process steps than those described for method 122.

After sputtering a number of wafers, build-up of metal and metal-nitride on shields 114 and in target corner areas 120 becomes problematic. Preferably, methods of the invention are employed after between about 25 and 500 wafers have been processed, more preferably between about 200 and 500 wafers. Also preferably, methods of the invention are employed after the target has been used for between about 10 and 200 kWh, more preferably between about 80 and 200 kWh. One-skilled in the art would recognize that non-planar targets of any number of configurations can exhibit this build up problem. After the last wafer has been removed, and the power (DC power used to generate the plasma) to the system is turned off, method 122 begins. First a PEC (Protect Electrostatic Chuck) or dummy wafer is inserted into the apparatus. See 124. The PEC wafer is used as a surrogate substrate to protect the wafer holder 112 from exposure to the plasma created in methods of the invention.

Next a pasting process is performed using a first magnetic field configuration. See 126. Preferably each of a plurality of electromagnetic coils used to create the first magnetic field configuration have the same polarity as when they are used in the sputter process. If so, then preferably this paste process is used to encapsulate built up material on the shields or areas other than those on the target. In this example, the nitrogen flow is turned off so that target metal is sputtered onto the shields to encapsulate the metal-nitride thereon.

After operation 126, next a pasting process is performed using a second magnetic field configuration. See 128. Preferably this paste process is used to remove (via erosion) built up sputter material on the target. In this example, the nitrogen flow is turned off so that no metal-nitride is formed during the paste process. One skilled in the art would understand that sputtering under such configurations can also encapsulate built up material on other interior surfaces of the sputter apparatus (including the target), since the deposition-erosion profile of the system is altered from its previous configuration. Preferably the second magnetic field configuration is produced by switching the polarity of at least one of the plurality of electromagnetic coils from its state used for the first magnetic field configuration.

Figure 4:
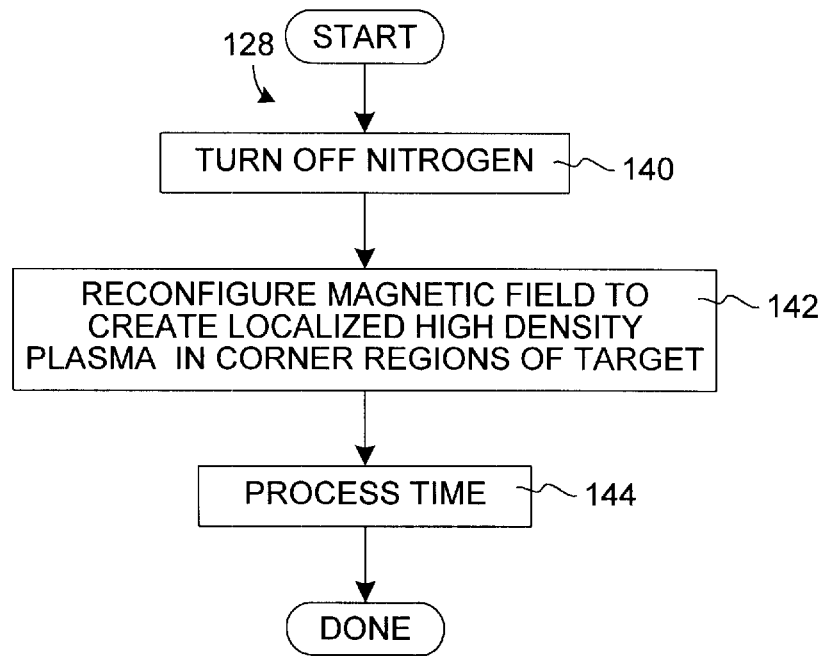

As mentioned, in a particularly preferred method, the order of blocks 126 and 128 are reversed. FIG. 4 is a flowchart that describes aspects of block 128 of FIG. 3 when block 128 is performed before block 126. First the nitrogen flow is turned off. See 140. As mentioned, in this example, nitride formation is not desirable during the pasting process. Next the magnetic field is configured to create a localized high-density plasma in the corner regions of the target. See 142. One skilled in the art would recognize that various magnetic field configurations would apply to specific target shapes, that is, more generally the magnetic field is changed to create a high-density plasma in areas of the target where there is build up of material from a previous sputter process. In more specific embodiments, the magnetic field is configured to create the high-density plasma localized at regions of the target where deposition-erosion boundaries exist. Preferably, the magnetic field configuration is produced by changing the polarity of at least one of the electromagnetic coils used to generate the first magnetic field configuration. The DC power is turned on to produce plasma for a defined process time. See 144. Preferably pasting using the second magnetic field configuration takes between about 10 and 60 seconds, more preferably about 20 seconds. Then operation 128 is done.

Figure 5:
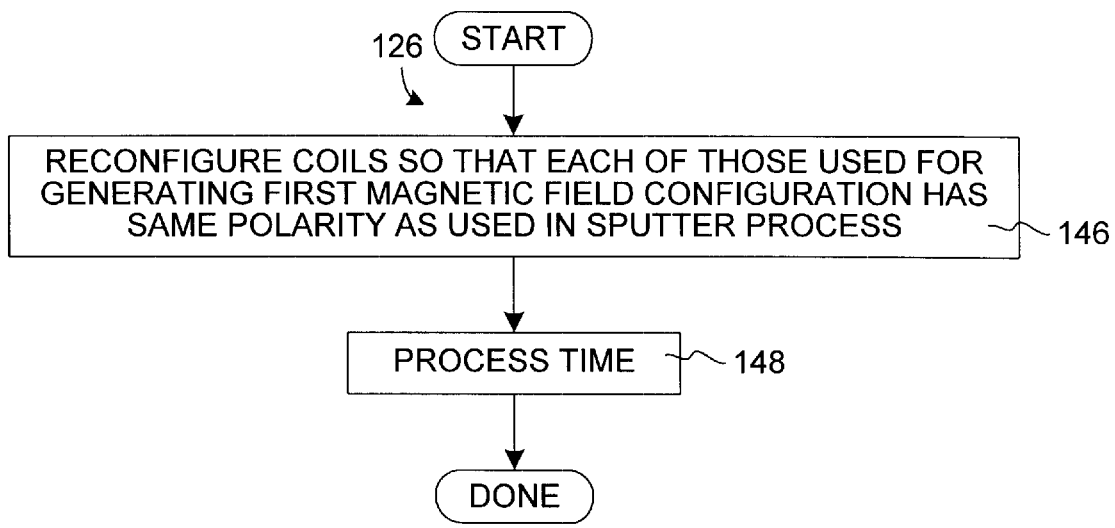

Referring to FIG. 5, describing block 126 (when performed after 128), the plasma producing electromagnetic coils are reconfigured so that each of the plurality of electromagnetic coils used to create the first magnetic field configuration has the same polarity as when used in the sputter process. See 146. The plasma produced during this second pasting operation is maintained for a defined process time. See 148. Preferably pasting using the first magnetic field configuration takes between about 60 and 200 seconds, more preferably about 120 seconds. Then operation 126 is done.

Again referring back to FIG. 3, after a preferred pasting process is complete, the sputter apparatus may be conditioned. See 130. Conditioning refers to sputtering a material onto the interior surfaces of a sputter chamber to negate a first wafer effect during subsequent processing. The first wafer effect generally refers to a condition in the sputter chamber which adversely affects the first wafer of a given batch of processed wafers. In this example, the first wafer effect is caused by a deficiency of nitrogen in the process chamber, caused by a tantalum coating on the shield and target after pasting. The tantalum encapsulation material absorbs nitrogen from a gas mixture within the sputter chamber until an equilibrium is reached with that gas mixture. Normally it would take a few wafers (including the first wafer) worth of processing to reach this equilibrium and provide satisfactory sputter results (e.g. when an in situ metal-nitride is sputtered onto the wafer). Therefore in this example, a metal-nitride is sputtered onto these surfaces in order to stabilize this surface condition. In this way, process uniformity is ensured for an entire batch of wafers, including the first wafer. In some instances, conditioning is not desirable.

Next, after plasma generation is complete, the PEC wafer is removed. See 132. The apparatus is now ready for processing a new batch of wafers. A new wafer is inserted. See 134. Next the wafer is processed using a desired sputter technique. In this example, metal-nitride (formed in-situ as described above) is deposited on the wafer. See 136. Next a decision is made as to whether or not the particle performance is acceptable. For example, the wafer just processed is checked for contamination by particulates caused by flaking of build up on interior surfaces of the sputter apparatus. As mentioned above, flaking can be well characterized in a particular system, and thus a particular number of wafers can be processed before flaking occurs at unacceptable levels. See 138. If the particle performance is acceptable, then the method proceeds at block 134–138; that is a new wafer is processed and the particle performance is assessed. If the particle performance is not acceptable, then the method returns to block 124 so that the pasting process is repeated. After a desired number of wafers has been processed, vida supra, the method is done.

EXPERIMENTAL

Figure 6:
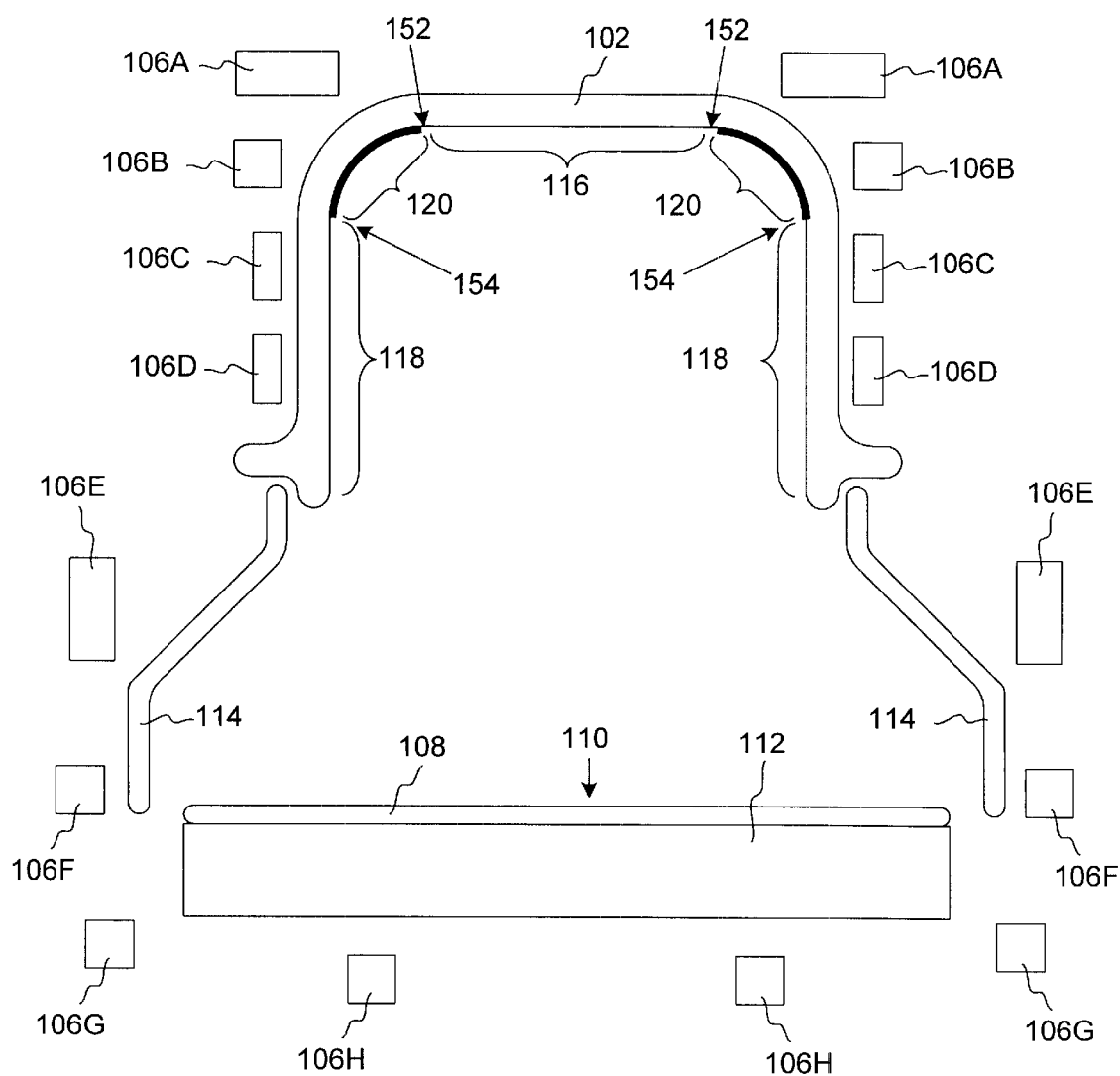
FIGS. 6, 7, and 9 show simplified cross-sectional diagrams of a sputter apparatus and sputter deposition/erosion profiles in accordance with the invention.

The following is a general description of an exemplary pasting method of the invention developed for use with the INOVA xT system. For simplicity, some reference numbers used in FIG. 1 are repeated in the figures below. FIG. 6 depicts a simplified cross sectional view of the HCM target 102, shields 114, and electromagnetic coils 106A–106H (permanent magnets not shown, refer to FIG. 1), for the INOVA xT source.

As mentioned, during a sputter process metals and metal-derived materials often build up on interior surfaces of sputter apparatus as a result of the sputter process. For example, in the case of apparatus as described in relation to FIG. 6, when producing in-situ metal nitrides, build-up and subsequent flaking occur on shields 114 and in the corner areas, 120, of target 102. In this example, only deposition patterns on the target are shown (areas 120). On the inner surface of target 102, areas 1where there is net deposition during sputtering are denoted with heavy black lines; areas (116 and 118) where there is net erosion during sputtering have no heavy black lines. The heavy black lines are meant only to denote qualitatively the deposition-erosion pattern. At the interfaces between deposition laden corner areas 120 and eroded areas 116 and 118, i.e. deposition-erosion boundaries 152 and 154, flaking occurs. Thus such deposition-erosion profiles become problematic with time, as deposited material builds up on isolated areas of the target.

In an exemplary Ta(N) sputter process, the configuration of the electromagnetic coils 106A–106H (refer to FIG. 6) are as follows (Table 1):

TABLE 1

Example Sputter Process Magnetic Coil Configuration.

| Electromagnetic Coil | Coil Strength |
|---|---|
| 106A | 2015 amp turn |
| 106B | 1149 amp turn |
| 106C | 647 amp turn |
| 106D | 416 amp turn |
| 106E | −598 amp turn |
| 106F | −174 amp turn |
| 106G | −211 amp turn |
| 106H | 308 amp turn |

An amp-turn is ampere (current unit) multiplied by turns (how many turns used for coils made by copper wires). The INOVA xT source is characterized by an HCM target (3D target and wafer biased to between −200 and −500V) with coils around the HCM target as well as down stream (e.g. around shields 114 and below target, as depicted in FIG. 6). The magnetic field created by coils 106A–106H can provide high-density plasma (on the order of $10^{13}$ atoms/cm3). Coils 106G–H are not depicted in FIGS. 7 and 9 because they are not used during the described pasting process.

Figure 7:
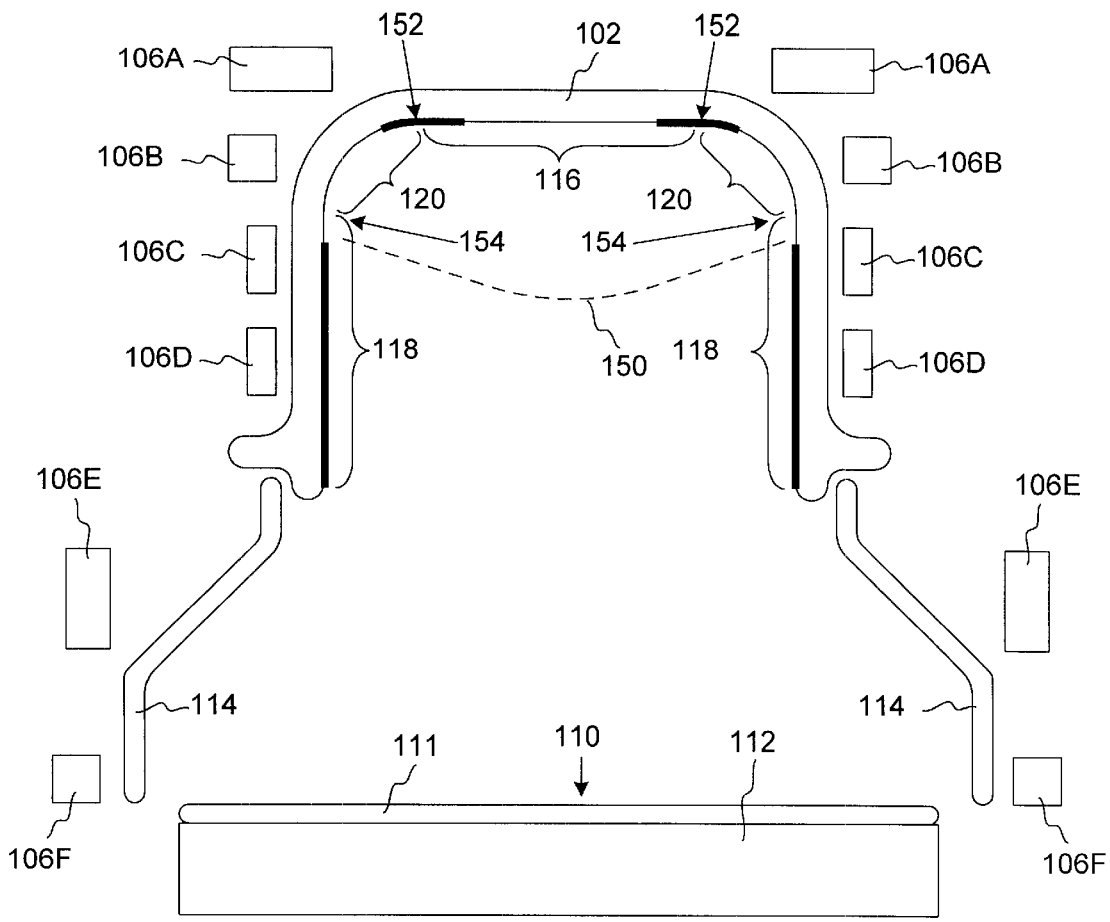

Referring to FIG. 7, during an exemplary pasting process, first a sacrificial dummy wafer 111 is put on wafer support 112 to protect the wafer support from contamination. In accordance with the process flows of FIGS. 3–5, pasting is performed using a second magnetic field configuration, for example as follows (Table 2):

TABLE 2

Example Paste Process, Second Magnetic Coil Configuration.

| Electromagnetic Coil | Coil Strength |
|---|---|
| 106A | 0 amp turn |
| 106B | 4420 amp turn |
| 106C | −2310 amp turn |
| 106D | 0 amp turn |
| 106E | 0 amp turn |
| 106F | 0 amp turn |
| 106G | 0 amp turn |
| 106H | 0 amp turn |

As depicted in FIG. 7, with the above coil configuration, the deposition-erosion profile on the inner surface of target 102 is changed (relative to that for the sputter process). Most notably, as indicated by the heavy black lines, the profile is changed such that there is net deposition on the previous sputter deposition-erosion boundary 152, therefore encapsulation takes place over that boundary. Also, net erosion is effected on the previous sputter deposition-erosion boundary 154, therefore any potentially flakable material is removed during the first paste step. Note that although there is also net deposition in a portion of area 118 of target 102, this material is eroded evenly during, for example, the sputter process and is not problematic. Line 150 is the zero-flux line, delineating areas in the chamber of positive and negative flux (positive flux above line 150, negative below line 150).

Figure 8:
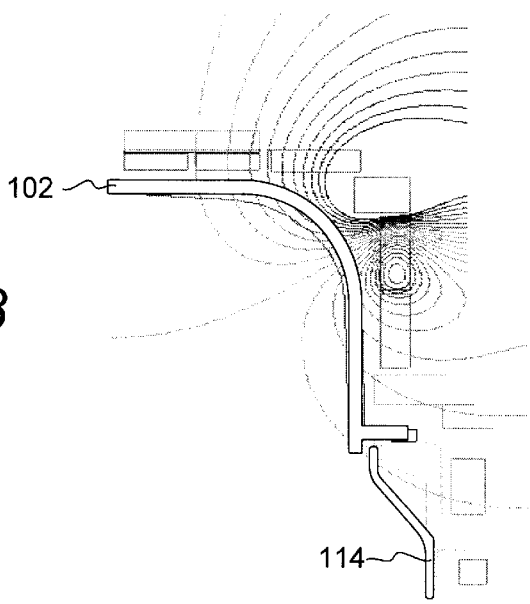
FIGS. 8 and 10 show magnetic field shape with respect to pasting methods of the invention and sputter apparatus depicted in FIGS. 6 and 8, respectively.

FIG. 8 shows calculated magnetic force lines in the interior region of target 102 (only ½ of target depicted) for the magnetic coil configuration outlined in Table 2. The plots were generated using Maxwell modeling tool available from Ansoft Corporation of Pittsburgh, Pa. Note that is this example, the magnetic field configuration provides for formation of a high-density plasma focused in region 154 of the interior of target 102.

Figure 9:
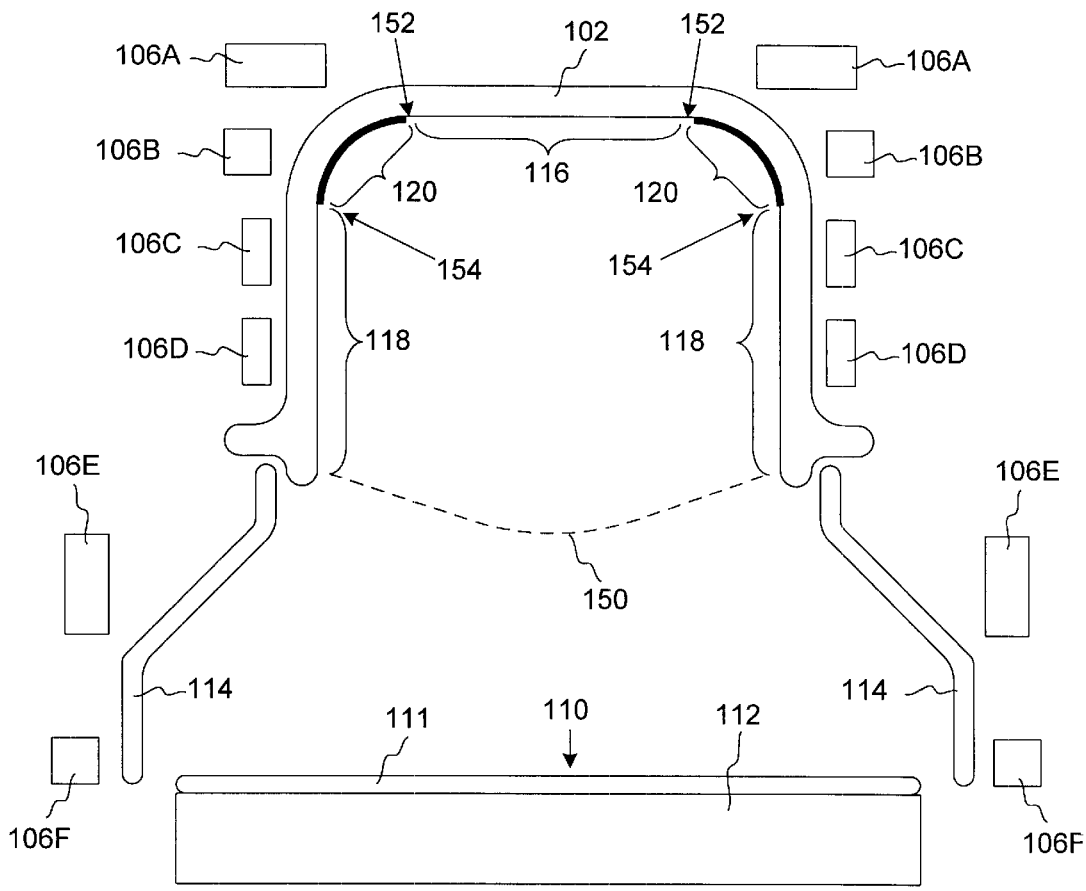

Referring to FIG. 9, during a second step of the exemplary pasting process, a first magnetic field configuration is used, for example as follows (Table 3):

TABLE 3

Example Paste Process, First Magnetic Coil Configuration.

| Electromagnetic Coil | Coil Strength |
|---|---|
| 106A | 788.4 amp turn |
| 106B | 353.6 amp turn |
| 106C | 369.6 amp turn |
| 106D | 369.6 amp turn |
| 106E | −253 amp turn |
| 106F | −261 amp turn |
| 106G | 0 amp turn |
| 106H | 0 amp turn |

Figure 10:
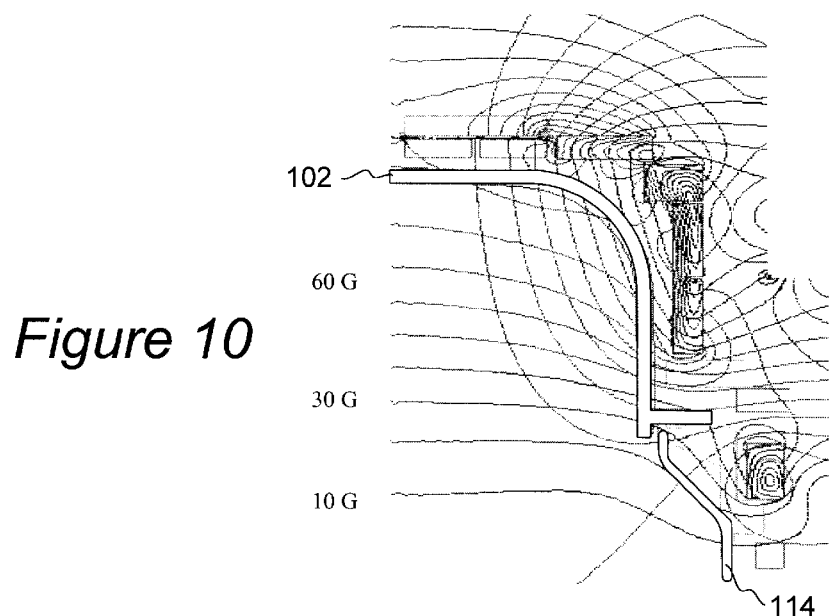

In both pasting steps the magnetic coils 106G and 106H (near wafer support 112) need not be energized. Note that the coil strength (polarity) pattern is the same as that for the sputter process (for coils 106A–F). Therefore the deposition-erosion profile is nearly the same as in the sputter process, see FIG. 9. In this pasting step, zero-flux line 150 is positioned more toward the open end of target 102. FIG. 10 shows the calculated magnetic force lines in the interior region of target 102 (only ½ of target depicted) for the magnetic coil configuration outlined in Table 3.

As described above, the steps of the pasting process described can be performed in either order, however when pasting is carried out in the order just described, the coils are more easily returned to the configuration used for the sputter process (after chamber conditioning, see FIG. 3).

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of preventing a metal or a metal-derived material from flaking from a surface within a sputter apparatus during a sputter process that uses a non-planar target, the method comprising modulating the magnetic field configuration in the sputter apparatus during a pasting process.

2. The method of claim 1, wherein modulating the magnetic field configuration in the sputter apparatus during the pasting process comprises:

(a) pasting using a first magnetic field configuration; and
   (b) pasting using a second magnetic field configuration;
   wherein each of a plurality of electromagnetic coils used for (a) have the same polarity as when used for the sputter process.

3. The method of claim 2, wherein the second magnetic field configuration is used to create a high-density plasma at a region of the non-planar target where a deposit of a sputtered material exists, said deposit created during a previous sputter process.

4. The method of claim 2, wherein the second magnetic field configuration is used to create a high-density plasma at a region of the non-planar target where a deposition-erosion boundary exists, said deposition-erosion boundary created during a previous sputter process.

5. The method of claim 2, wherein (a) takes between about 60 and 200 seconds and (b) takes between about 10 and 60 seconds.

6. The method of claim 2, wherein (a) takes about 120 seconds and (b) takes about 20 seconds.

7. The method of claim 1, wherein the metal comprises at least one of tantalum, titanium, tungsten, copper, cobalt, molybdenum, zirconium, chromium, and alloys thereof.

8. The method of claim 1, wherein the metal-derived material is a metal nitride.

9. The method of claim 8, wherein the metal nitride comprises at least one of tantalum nitride, titanium nitride, and tungsten nitride.

10. The method of claim 2, wherein the sputter process is used to deposit the metal or metal-derived material sequentially on a plurality of semiconductor wafers and the pasting process is repeated after between about 25 and 500 wafers have been exposed to the sputter process.

11. The method of claim 2, wherein the sputter process is used to deposit the metal or metal-derived material sequentially on a plurality of semiconductor wafers and the pasting process is repeated after between about 200 and 500 wafers have been exposed to the sputter process.

12. The method of claim 2, wherein the second magnetic field configuration is produced by switching the polarity of at least one of the plurality of electromagnetic coils used for (a).

13. The method of claim 1, wherein the non-planar target is a cup-shaped target.

14. The method of claim 2, wherein (a) and (b) are performed after the target has been used for between about 10 and 200 kWh.

15. The method of claim 2, wherein (a) and (b) are performed after the target has been used for between about 80 and 200 kWh.

16. The method of claim 2, wherein (b) is performed before (a).

* * * * *